(12) United States Patent
Park et al.

(10) Patent No.: US 10,648,872 B2
(45) Date of Patent: May 12, 2020

(54) SENSOR DEVICE FOR DETECTING PRESSURE

(71) Applicant: LG INNOTEK CO., LTD., Seoul (KR)

(72) Inventors: Yong Hwa Park, Seoul (KR); Bi Yi Kim, Seoul (KR); Seung Jin Kim, Seoul (KR); Hyun Gyu Park, Seoul (KR); Hyung Yoon, Seoul (KR); In Hee Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 30 days.

(21) Appl. No.: 16/061,035

(22) PCT Filed: Dec. 9, 2016

(86) PCT No.: PCT/KR2016/014451
§ 371 (c)(1),
(2) Date: Jun. 11, 2018

(87) PCT Pub. No.: WO2017/099522
PCT Pub. Date: Jun. 15, 2017

(65) Prior Publication Data
US 2018/0356300 A1    Dec. 13, 2018

(30) Foreign Application Priority Data

Dec. 11, 2015    (KR) .................. 10-2015-0177173

(51) Int. Cl.
*G01L 1/14* (2006.01)
*H05K 1/14* (2006.01)
*H05K 1/18* (2006.01)

(52) U.S. Cl.
CPC .............. *G01L 1/144* (2013.01); *G01L 1/142* (2013.01); *H05K 1/147* (2013.01); *H05K 1/189* (2013.01);
(Continued)

(58) Field of Classification Search
CPC ......... G01L 1/144; G10L 1/142; H05K 1/147; H05K 1/189; H05K 2201/10015; H05K 2201/10151
(Continued)

(56) References Cited

U.S. PATENT DOCUMENTS 7,247,590 B2    7/2007    Kawabata et al.
7,518,202 B2    4/2009    Tanie et al.
(Continued)

FOREIGN PATENT DOCUMENTS

JP    3593184    11/2004
JP    2009-042108    2/2009
(Continued)

OTHER PUBLICATIONS

International Search Report (with English Translation) and Written Opinion dated Mar. 7, 2017 issued in Application No. PCT/KR2016/014451.
(Continued)

*Primary Examiner* — Octavia Hollington
(74) *Attorney, Agent, or Firm* — KED & Associates, LLP

(57) ABSTRACT

A sensor device may include an elastic dielectric; a sensing unit including a first wiring and a second wiring for outputting sensing signals, and a flexible printed circuit board provided with a first connection terminal to which the first wiring is connected, and with a second connection terminal to which the second wiring is connected. The first wiring is formed on one surface of the dielectric and may be connected to the first connection terminal. The second wiring is formed on another surface of the dielectric facing the surface on which the first wiring is formed and may be connected to the second connection terminal.

14 Claims, 5 Drawing Sheets

(52) U.S. Cl.
CPC .............. *H05K 2201/10015* (2013.01); *H05K 2201/10151* (2013.01)

(58) Field of Classification Search
USPC .......................................................... 73/780
See application file for complete search history.

(56) References Cited

U.S. PATENT DOCUMENTS

| | | | | |
|---|---|---|---|---|
| 8,287,289 | B2* | 10/2012 | Niitsu .................... | H05K 3/368 |
| | | | | 439/66 |
| 9,136,035 | B2* | 9/2015 | Itou .......................... | H01B 1/24 |
| 10,251,262 | B2* | 4/2019 | Ogura ..................... | H01B 5/14 |
| 2012/0026700 | A1* | 2/2012 | Furuta ................... | H05K 3/361 |
| | | | | 361/750 |
| 2013/0209741 | A1 | 8/2013 | Kasagi et al. | |
| 2014/0090884 | A1 | 4/2014 | Kobayashi et al. | |
| 2014/0150571 | A1* | 6/2014 | Kuniyoshi .............. | G01L 1/205 |
| | | | | 73/862.625 |

FOREIGN PATENT DOCUMENTS

| | | | |
|---|---|---|---|
| JP | 2012007988 | * | 1/2012 |
| JP | 5486417 | | 5/2014 |
| JP | 2014-142193 | | 8/2014 |
| JP | 2014142193 | * | 8/2014 |
| KR | 10-2013-0022544 | | 3/2013 |

OTHER PUBLICATIONS

United States Office Action dated Sep. 19, 2019 issued in co-pending related U.S. Appl. No. 16/061,066.

* cited by examiner

SENSOR DEVICE FOR DETECTING PRESSURE

CROSS-REFERENCE TO RELATED PATENT APPLICATIONS

This application is a U.S. National Stage Application under 35 U.S.C. § 371 of PCT Application No. PCT/KR2016/014451, filed Dec. 9, 2016, which claims priority to Korean Patent Application No. 10-2015-0177173, filed Dec. 11, 2015, whose entire disclosures are hereby incorporated by reference.

TECHNICAL FIELD

The present invention relates to a sensor device for detecting pressure. In more detail, the present invention relates to a pressure sensor device using electronic fibers capable of sensing pressure.

BACKGROUND ART

An electronic fiber refers to a system formed by combining a general fiber with a conductive fiber formed using a conductive ink and the like, with a micro electronic component, and the like. In a next-generation computing study field, a study of combining a computing function with daily fabric-based accessories such as clothes, bags and shoes worn by people to form an intelligent object has been vigorously performed. In a fashion field, attempts of designing new types of clothes using electronic fabrics have been performed.

A part of study in an electronic fiber field is attempts to re-develop existing electronic components or mechanical components, which are not formed of fabric materials, using conductive fiber materials. As an example thereof, there are a fabric button for replacing a mechanical button or a fabric pressure sensor for replacing a pressure sensor, and the like.

A micro electronic component for transmitting an electrical signal generated by a conductive fiber material is coupled to a product to which electronic fibers are applied. A flexible printed circuit board (FPCB) on which the micro electronic component is mounted is connected to an electronic fiber in consideration of a flexible property of the electronic fiber.

Accordingly, it is necessary to provide a technology to connect an FPCB to an electronic fiber.

DISCLOSURE OF INVENTION

Technical Problem

A technical aspect of the present invention is to provide a pressure sensor device including a flexible printed circuit board connected to an electronic fiber capable of sensing pressure.

Additional technical aspects of the present invention are not limited to the above-stated technical aspect and other unstated technical aspects will be clearly understood by those skilled in the art from the following description.

Technical Solution

According to one aspect of the present invention, a pressure sensor device includes a sensing portion which comprises an elastic dielectric, a first wiring, and a second wiring and a flexible printed circuit board which comprises a first connection terminal and a second connection terminal. Here, the first wiring outputs a sensing signal, is formed on any one surface of the elastic dielectric, and is connected to the first connection terminal, and the second wiring outputs a sensing signal, is formed on another surface of the elastic dielectric, which faces the surface on which the first wiring is formed, and is connected to the second connection terminal.

Advantageous Effects

According to the present invention, there is an effect in which a flexible printed circuit board may be effectively connected to a wiring which outputs an electrical signal of an electronic fiber.

MODE FOR INVENTION

Figure 1:
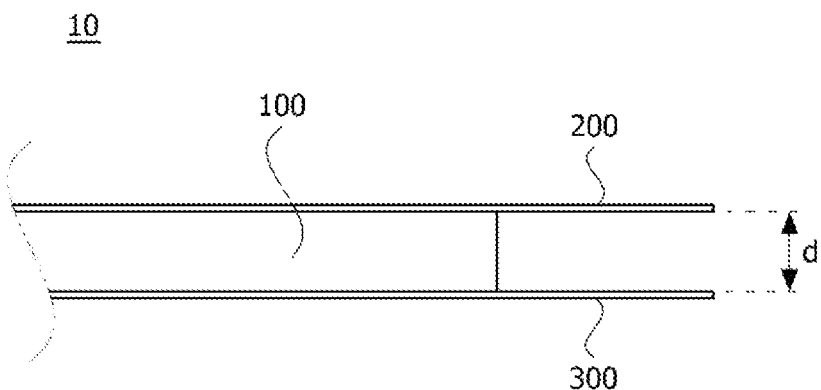
FIG. 1 is a cross-sectional view illustrating a sensing portion according to one embodiment of the present invention.

Hereinafter, exemplary embodiments of the present invention will be described in detail with reference to the attached drawings. Advantages and features of the present invention and methods of achieving them will be specified with reference to the attached drawings and following detailed-described embodiments. However, the present invention is not limited to the embodiments described below and may be embodied in various different forms. The embodiments are provided merely to completely disclose the present invention and completely inform one of ordinary skill in the art of the scope of the present invention. The present invention is defined by only the scope of the claims. Throughout the specification, like reference numerals refer to like elements.

Unless defined otherwise, all the terms (including technical and scientific terms) used in the specification may be used as meanings understood in common by one of ordinary skill in the art. Also, the terms defined in generally used dictionaries, unless clearly and particularly defined, will not be ideally or excessively interpreted.

Figure 2:
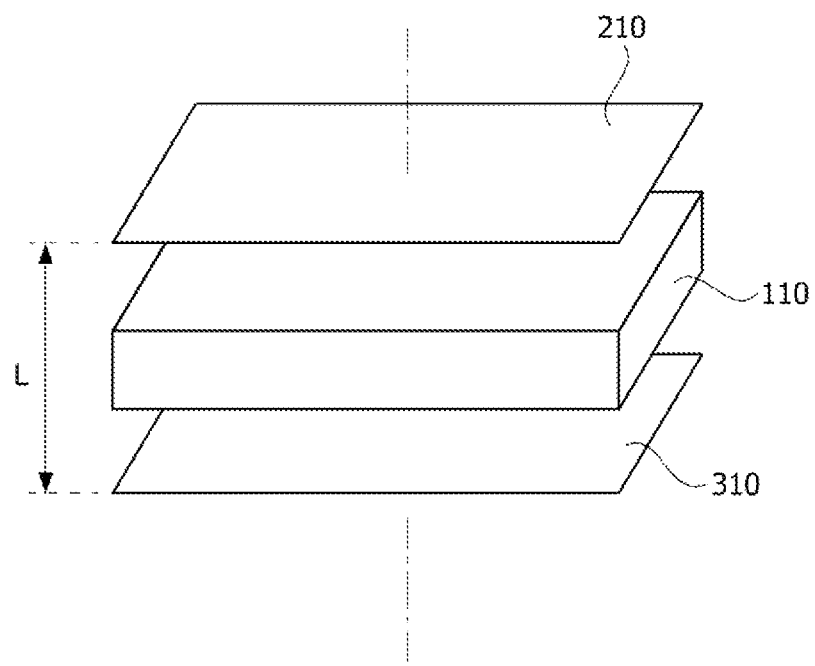
FIG. 2 is a view illustrating modeling of the sensing portion according to one embodiment of the present invention.

FIG. 1 is a cross-sectional view illustrating a sensing portion according to one embodiment of the present invention, and FIG. 2 is a view illustrating modeling of the sensing portion according to one embodiment of the present invention.

A pressure sensor device according to one embodiment of the present invention will be described with reference to FIGS. 1 and 2.

The pressure sensor device according to one embodiment of the present invention may include a sensing portion 10 and flexible printed circuit boards 50 and 70.

Referring to FIG. 1, the sensing portion 10 according to one embodiment of the present invention may include an elastic dielectric 100 and a first wiring 200 and a second wiring 300, which output sensing signals.

The first wiring 200 may be conductive fibers formed on a top surface of the elastic dielectric 100. The second wiring 300 may be conductive fibers formed on a bottom surface of the elastic dielectric 100, which faces the top surface. The top surface and the bottom surface are relative expressions. When any one surface of the elastic dielectric 100 is the top surface, another surface of the elastic dielectric 100 may be the bottom surface which faces the top surface. Although it is described for convenience of description that an upper surface of the elastic dielectric 100 is referred to as the top surface and a lower surface thereof is referred to as the bottom surface, it is merely an example and the present invention is not limited thereto.

The elastic dielectric 100 is a dielectric having elasticity. The elastic dielectric 100 is a dielectric formed to be elastically deformed when an external contact force is applied and formed of a material having a restoration force and elasticity to return to its original shape when the contact force is removed.

The elastic dielectric 100 may include an elastic body and conductive composites dispersed within the elastic body. Here, the elastic body may be foam, non-woven fabric, a fiber material having a random arrangement such as a nanoweb and the like, a synthetic fiber including one selected from the group consisting of polyurethane, nylon, polyethylene terephthalate, and polyester, a natural fiber, an elastomer, rubber, urethane, or the like. Accordingly, the elastic dielectric 100 includes micro air holes and has elasticity. Here, a thickness of the elastic dielectric 100 may be 1 to 4 mm. When the thickness of the elastic dielectric 100 is less than 1 mm, it may be difficult to maintain an insulation function in a normal state, that is, a state in which an external force is not applied, and a change in resistance may be small because the change in thickness is small when an external force is applied. Accordingly, pressure sensing efficiency may be decreased. When the thickness of the elastic dielectric 100 exceeds 4 mm, it is difficult to apply the elastic dielectric to an inside of a shoe.

The conductive composites included in the elastic dielectric 100 may be applied on the surface of the fibers which form the elastic body or may be dispersed within the elastic body.

The conductive composites may include conductive polymers and conductive powder. The conductive composites may be included at 1 to 10 wt % of the elastic body. When the conductive composites are included by more than 10 wt % of the elastic body, it is difficult to secure an insulation property in a state in which pressure is not applied. The conductive polymer may include polyaniline or polypyrrole. The conductive powder may include one selected from the group consisting of Au, Ag, Cu, Ni, carbon nano tubes (CNT), graphene, a ceramic filler.

The conductive powder may have a diameter of 10 nm to 500 μm and may have a spherical shape, a needle shape, or a plate shape. When the diameter of the conductive powder is less than 10 nm, resistance of the entire elastic dielectric 100 is decreased due to poor dispersion in the conductive powder and high resistance at an interface between particles. Also, when the diameter of the conductive power is more than 500 μm, a frictional force increases due to an uneven surface of the elastic dielectric 100 such that processing may be difficult.

The elastic dielectric 100 may have a shape in which a plurality of layers are stacked.

According to one embodiment of the present invention, the elastic dielectric 100 may be located between the first wiring 200 and the second wiring 300. When an external contact force is applied such that a shape of the elastic dielectric 100 changes, permittivity thereof may change. When the shape of the elastic dielectric 100 changes such that the permittivity changes, the first wiring 200 and the second wiring 300 may transmit a signal according to the change in permittivity to the outside.

The first wiring 200 and the second wiring 300 may be conductive fibers. The first wiring 200 and the second wiring 300 may include adhesive layers for attaching the first wiring 200 and the second wiring 300 to the elastic dielectric 100.

Referring to FIG. 2, an electronic fiber on which the elastic dielectric 100 is located between the first wiring 200 and the second wiring 300 may be modeled to be a capacitor 20.

In the capacitor 20, an elastic dielectric 110 is located between a top end surface 210 and a bottom end surface 310. When areas of the top end surface 210 and the bottom end surface 310 are referred to as A, a distance between the top end surface 210 and the bottom end surface 310 is referred to as L, and permittivity of the dielectric is ε, capacitance C of the capacitor 20 is like of a following equation.

$$C = \varepsilon \frac{A}{L}$$

As described above, when the permittivity and the areas are uniform, the capacitance is inversely proportional to the distance between the top end surface 210 and the bottom end surface 310.

Referring back to FIG. 1, according to one embodiment of the present invention, when the elastic dielectric 100 receives an external force and is deformed, a thickness d of the elastic dielectric 100 located between the first wiring 200 and the second wiring 300 changes, the capacitance between the first wiring 200 and the second wiring 300 changes. The first wiring 200 and the second wiring 300 may transmit a signal generated according to a change in the capacitance.

For example, when permittivity changes due to a change in shape of the elastic dielectric 100 while a constant voltage difference V is maintained, a current which flows through the first wiring 200 and the second wiring 300 changes according to an electric charge law of a capacitor such as Q=C/V. Accordingly, a current is measured at the first wiring 200 and the second wiring 300, an external force applied to the elastic dielectric 100 is estimated on the basis of the measured current, and a weight may be sensed according to the estimated external force.

Although it is shown in FIG. 1 that the sensing portion 10 includes one first wiring 200 and one second wiring 300, it is merely an example. In other embodiments, the sensing portion 10 may include one or more first wirings 200 and one or more second wirings 300.

FIGS. 3 to 8 are views illustrating that a flexible printed circuit board is connected to the sensing portion according to one embodiment of the present invention.

According to one embodiment of the present invention, the flexible printed circuit board may include a double-sided flexible printed circuit board and a single-sided flexible printed circuit board. The double-sided flexible printed circuit board is a flexible printed circuit board at which wirings of electronic fibers may be connected to a top surface and a bottom surface. At the single-sided flexible printed circuit board, a wiring of an electronic fiber may be connected to only a top surface thereof. The top surface and the bottom surface are relative expressions which refer to any one surface and another surface which faces the surface. In a description with reference to FIGS. 3 to 8, for convenience of description, an upper surface of a flexible printed circuit board is referred to as a top surface and a lower surface is referred to as a bottom surface but they are not limited thereto.

Figure 3:
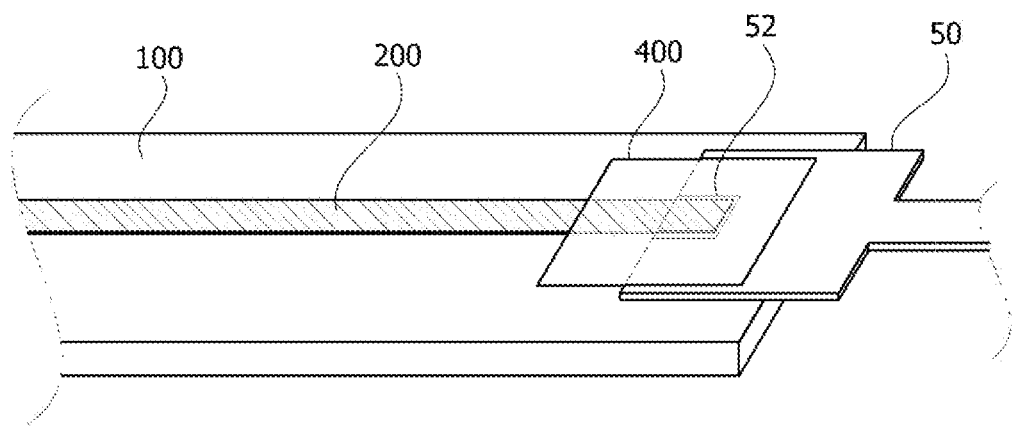
FIG. 3 is a perspective view illustrating a double-sided flexible printed circuit board connected to a top surface of the sensing portion according to one embodiment of the present invention.
Figure 4:
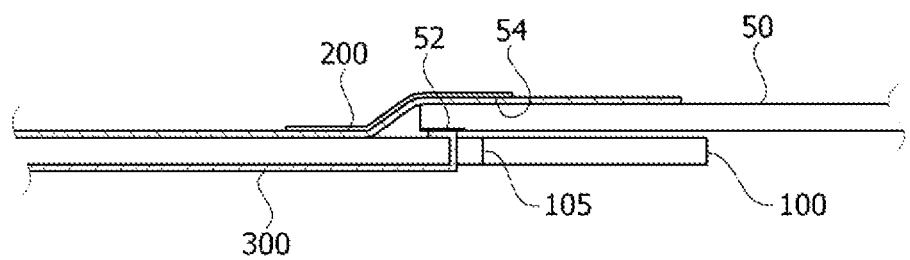
FIG. 4 is a cross-sectional view illustrating the double-sided flexible printed circuit board connected to the top surface of the sensing portion according to one embodiment of the present invention.

FIG. 3 is a perspective view illustrating a double-sided flexible printed circuit board connected to a top surface of the sensing portion according to one embodiment of the present invention, and FIG. 4 is a cross-sectional view illustrating the double-sided flexible printed circuit board connected to the top surface of the sensing portion according to one embodiment of the present invention.

It will be described with reference to FIGS. 3 and 4 that a double-sided flexible printed circuit board 50 is connected to the top surface of the sensing portion 10 according to one embodiment of the present invention.

The double-sided flexible printed circuit board 50 may include a first connection terminal 52 to which the first wiring 200 is connected and a second connection terminal 54 to which the second wiring 300 is connected. The elastic dielectric 100 may include a wiring hole 105 formed to pass through the top surface and the bottom surface of the elastic dielectric 100.

The first connection terminal 52 may be connected to the first wiring 200 at the top surface of the double-sided flexible printed circuit board 50. The second connection terminal 54 may be connected to the second wiring 300 through the wiring hole 105 at the bottom surface of the double-sided flexible printed circuit board 50.

Since the double-sided flexible printed circuit board 50 is located on the top surface of the elastic dielectric 100, the second wiring 300 may pass through the wiring hole 105 and extend to the top surface of the elastic dielectric 100. The second wiring 300 which extends to the top surface may be connected to the second connection terminal 54.

The pressure sensor device according to one embodiment of the present invention may include a fixing member 400. The fixing member 400 may fix connection between the first wiring 200 and the double-sided flexible printed circuit board 50.

For example, the fixing member 400 may be a tape material and may be additionally attached to the first wiring 200 and the double-sided flexible printed circuit board 50.

Although it is shown in FIGS. 3 and 4 that the double-sided flexible printed circuit board 50 is located on the top surface of the elastic dielectric 100, according to some embodiments of the present invention, the double-sided flexible printed circuit board 50 may be located on the bottom surface of the elastic dielectric 100.

When the double-sided flexible printed circuit board 50 is located on the bottom surface of the elastic dielectric 100, the second wiring 300 may be directly connected to the second connection terminal 54 and the first wiring 200 may pass through the wiring hole 105 and may be connected to the first connection terminal 52. Since this corresponds to an overturned case of the shown in FIGS. 3 and 4, a detailed description thereof will be omitted to avoid a repetitive description.

Figure 5:
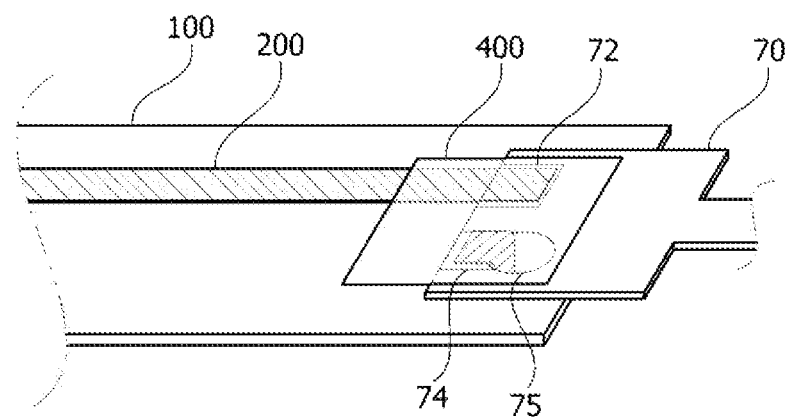
FIG. 5 is a perspective view illustrating a single-sided flexible printed circuit board connected to the top surface of the sensing portion according to one embodiment of the present invention.
Figure 6:
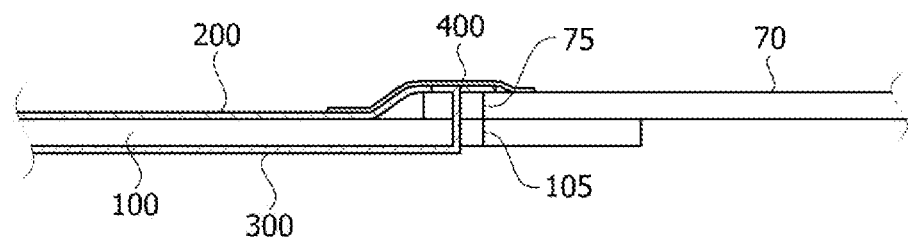
FIG. 6 is a cross-sectional view illustrating the single-sided flexible printed circuit board connected to the top surface of the sensing portion according to one embodiment of the present invention.

FIG. 5 is a perspective view illustrating a single-sided flexible printed circuit board connected to the top surface of the sensing portion according to one embodiment of the present invention, and FIG. 6 is a cross-sectional view illustrating the single-sided flexible printed circuit board connected to the top surface of the sensing portion according to one embodiment of the present invention.

It will be described with reference to FIGS. 5 and 6 that a single-sided flexible printed circuit board 70 is connected to the top surface of the sensing portion 10 according to one embodiment of the present invention.

The single-sided flexible printed circuit board 70 may include a first connection terminal 72 to which the first wiring 200 is connected and a second connection terminal 74 to which the second wiring 300 is connected. The first connection terminal 72 and the second connection terminal 74 may be provided on the same surface of the single-sided flexible printed circuit board 70. Although it is described with reference to FIGS. 5 and 6 for convenience of description that the first connection terminal 72 and the second connection terminal 74 are provided on the top surface of the single-sided flexible printed circuit board 70, they are not limited thereto.

The elastic dielectric 100 may include the wiring hole 105 formed to pass through the top surface and a bottom surface of the elastic dielectric 100.

The first connection terminal 52 may be connected to the first wiring 200 on the top surface of the single-sided flexible printed circuit board 70. The second connection terminal 74 may pass through the wiring hole 105 and a through hole 75 formed at the single-sided flexible printed circuit board 70 and may be connected to the second wiring 300. The through hole 75 may be a hole which passes through the top surface and the bottom surface of the single-sided flexible printed circuit board 70.

Since the single-sided flexible printed circuit board 70 is located on the top surface of the elastic dielectric 100, the second wiring 300 may pass through the wiring hole 105 and extend to the top surface of the elastic dielectric 100. The second wiring 300 which extends to the top surface may pass through the through hole 75 again and may be connected to the second connection terminal 74.

The pressure sensor device according to one embodiment of the present invention may include the fixing member 400. The fixing member 400 may fix connection among the first wiring 200, the second wiring 300 and the single-sided flexible printed circuit board 70.

For example, the fixing member 400 may be a tape material and may be additionally attached to the first wiring 200, the second wiring 300, and the single-sided flexible printed circuit board 70.

Although it is shown in FIGS. 5 and 6 that the single-sided flexible printed circuit board 70 is located on the top surface of the elastic dielectric 100, according to some embodiments of the present invention, the single-sided flexible printed circuit board 70 may be located on the bottom surface of the elastic dielectric 100.

When the single-sided flexible printed circuit board 70 is located on the bottom surface of the elastic dielectric 100, the second wiring 300 may be directly connected to the second connection terminal 74 and the first wiring 200 may pass through the wiring hole 105 and the through hole 75 and may be connected to the first connection terminal 72. Since this corresponds to an overturned case of the shown in FIGS. 5 and 6, a detailed description thereof will be omitted to avoid a repetitive description.

Referring back to FIGS. 7 and 8, the double-sided flexible printed circuit board 50 or the single-sided flexible printed circuit board 70 is located on any one surface of the elastic dielectric 100 such that the double-sided flexible printed circuit board 50 or the single-sided flexible printed circuit board 70 may also be bent or curved when the elastic dielectric 100 is bent or curved. Accordingly, the pressure sensor device may have flexibility.

Figure 7:
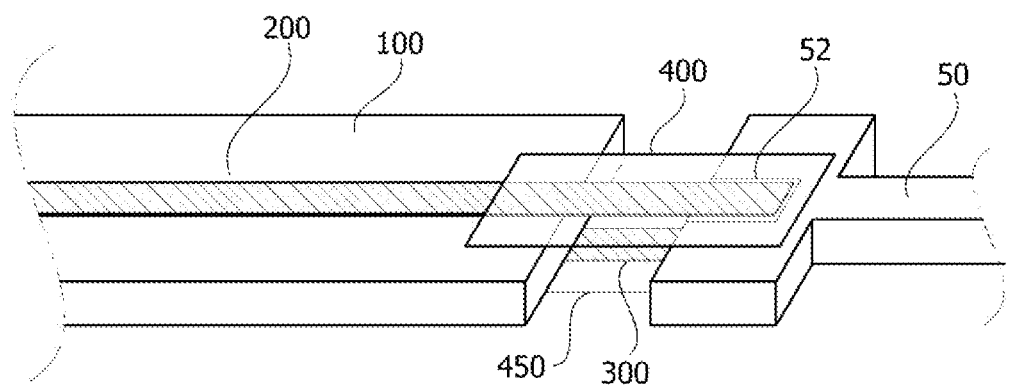
FIG. 7 is a perspective view illustrating the double-sided flexible printed circuit board connected to a side surface of the sensing portion according to one embodiment of the present invention.
Figure 8:
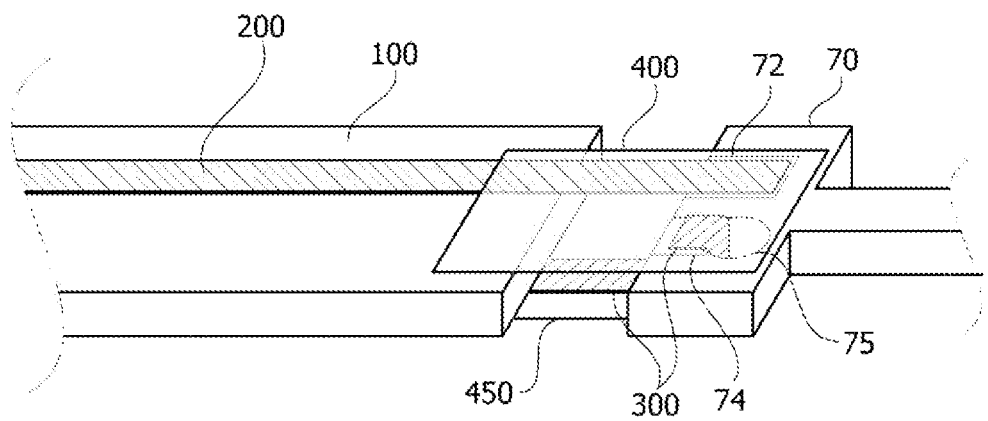
FIG. 8 is a perspective view illustrating the single-sided flexible printed circuit board connected to the side surface of the sensing portion according to one embodiment of the present invention.

FIG. 7 is a perspective view illustrating the double-sided flexible printed circuit board connected to a side surface of the sensing portion according to one embodiment of the present invention, and FIG. 8 is a perspective view illustrating the single-sided flexible printed circuit board connected to the side surface of the sensing portion according to one embodiment of the present invention.

The double-sided flexible printed circuit board 50 connected to the side surface of the sensing portion according to one embodiment of the present invention will be described with reference to FIG. 7.

The double-sided flexible printed circuit board 50 according to one embodiment of the present invention may include the first connection terminal 52 connected to the first wiring 200 and the second connection terminal to which the second wiring 300 is connected.

The first connection terminal 52 may be located on any one surface of the double-sided flexible printed circuit board 50, and the second connection terminal may be located on another surface which faces the any one surface.

Referring to FIG. 7, although the first connection terminal 52 may be located on the top surface of the double-sided flexible printed circuit board 50 and the second connection terminal may be located on the bottom surface of the double-sided flexible printed circuit board 50, the top surface and the bottom surface are exemplary terms on the basis of the shown in FIG. 7 and the present invention is not limited thereto.

When the first wiring 200 and the second wiring 300 are connected to the double-sided flexible printed circuit board 50, fixing members 400 and 450 may be attached to fix and support the connection. A first fixing member 400 may fix the elastic dielectric 100, the first wiring 200, and the first connection terminal 52. A second fixing member 450 may fix the elastic dielectric 100, the second wiring 300, and the second connection terminal.

For example, the fixing members 400 and 450 may be tape materials. The first fixing member 400 may be a tape additionally attached to the elastic dielectric 100, the first wiring 200, and the first connection terminal 52. The second fixing member 450 may be a tape additionally attached to the elastic dielectric 100, the second wiring 300, and the second connection terminal.

The single-sided flexible printed circuit board 70 connected to the side surface of the sensing portion according to one embodiment of the present invention will be described with reference to FIG. 8.

The single-sided flexible printed circuit board 70 according to one embodiment of the present invention may include the first connection terminal 72, the second connection terminal 74, and the through hole 75.

The first connection terminal 72 may be a terminal to which the first wiring 200 is connected, and the second connection terminal 74 may be a terminal to which the second wiring is connected. The first connection terminal 72 and the second connection terminal 74 may be located on the same surface of the single-sided flexible printed circuit board 70. For example, as shown in FIG. 8, the first connection terminal 72 and the second connection terminal 74 may be located on the top surface of the single-sided flexible printed circuit board 70.

The through hole 75 may be a hole which passes through the top surface and the bottom surface of the single-sided flexible printed circuit board 70 to allow the second wiring 300 to pass therethrough. Referring to FIG. 8, the through hole 75 may be a cylindrical groove but is merely an example and is not limited thereto.

The second wiring 300 may pass through the bottom surface of the single-sided flexible printed circuit board 70, may extend to the top surface of the single-sided flexible printed circuit board 70 via the through hole 75, and may be connected to the second connection terminal 74 located on the top surface of the single-sided flexible printed circuit board 70.

Figure 9:
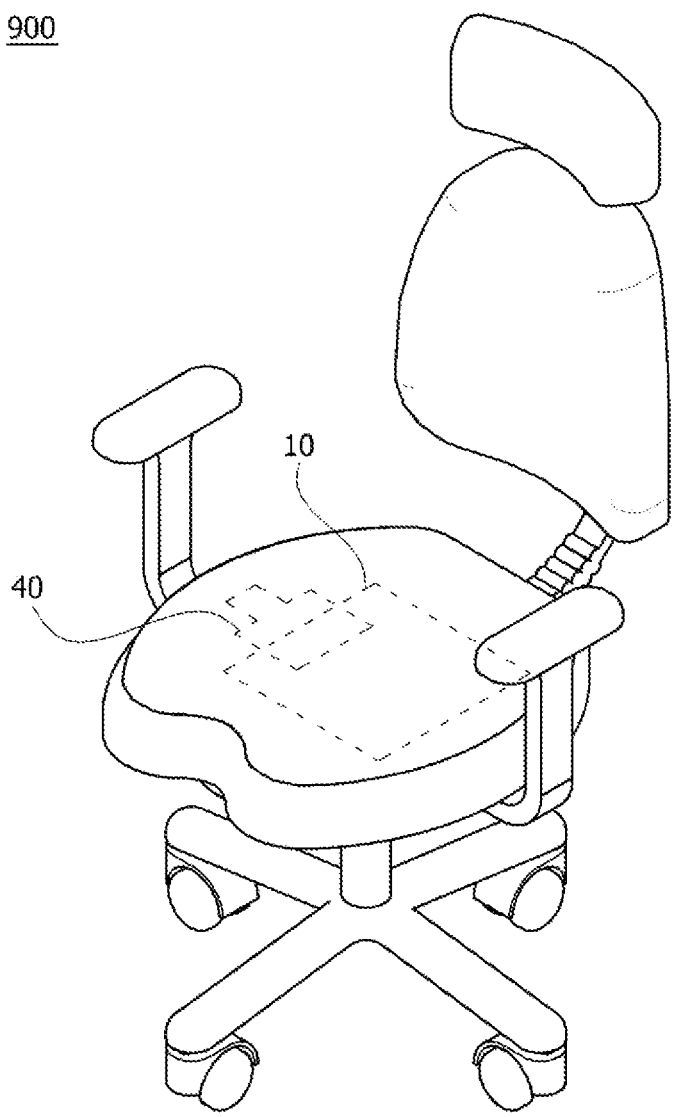
FIGS. 9 and 10 are views illustrating a state in which the pressure sensor device according to one embodiment of the present invention is installed at a chair.
Figure 10:
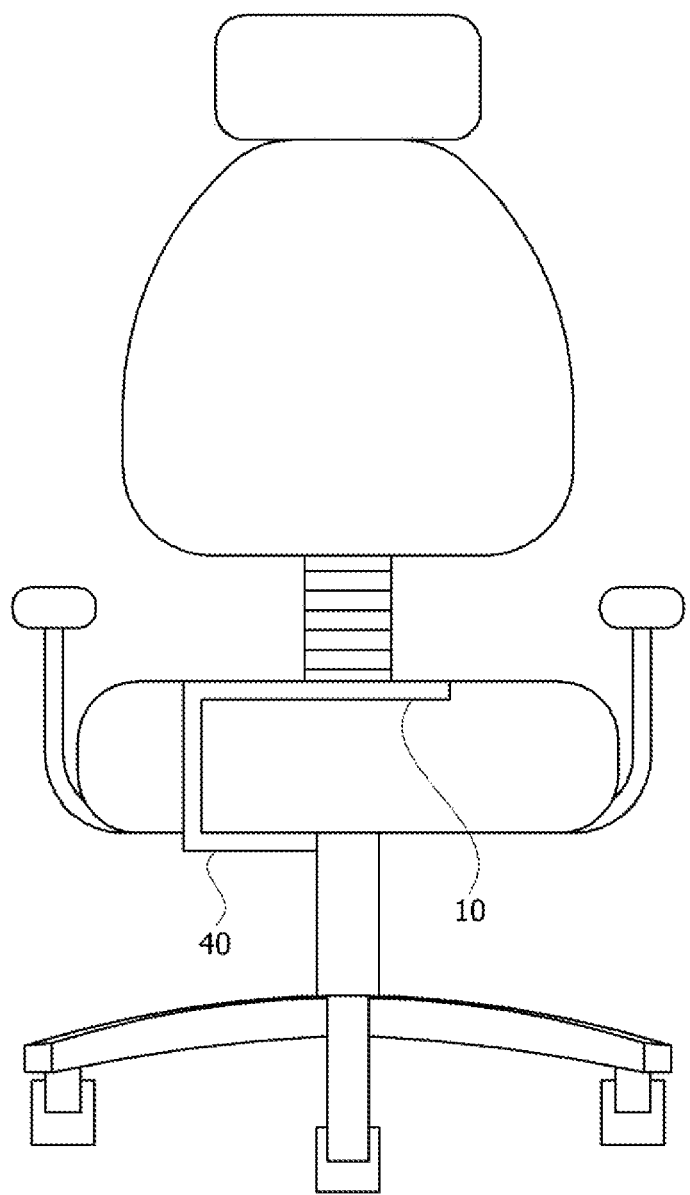

FIGS. 9 and 10 are views illustrating a state in which the pressure sensor device according to one embodiment of the present invention is installed at a chair.

Referring to FIGS. 9 and 10, the sensing portion 10 may be installed in a seat of a chair 900 and a flexible printed circuit board 40 connected to the sensing portion 10 may be bent and installed below the seat.

The flexible printed circuit board 40 may include the double-sided flexible printed circuit board 50 or the single-sided flexible printed circuit board 70.

Since the sensing portion 10 may be formed of conductive electronic fibers to have flexibility and the flexible printed circuit board 40 has flexibility, the pressure sensor device according to one embodiment of the present invention may be freely installed.

The pressure sensor device according to one embodiment of the present invention may be installed to check whether a human is seated in the chair 900. In addition, a weight of the human may be measured to determine health conditions on the basis of the weight.

Although the embodiments of the present invention have been described with reference to the attached drawings, it should be understood by one of ordinary skill in the art that the present invention may be implemented in other detailed forms without changing the technical concept or essential features thereof. Therefore, the above-described embodiments should be understood as being exemplary not limitative in every aspect.

The invention claimed is:
1. A pressure sensor device comprising:
   a sensing portion which comprises an elastic dielectric, a first wiring, and a second wiring; and a flexible printed circuit board, spaced away from the sensing portion, and the flexible printed circuit board comprises a first connection terminal and a second connection terminal, the flexible printed circuit board having a first circuit board surface and a second circuit board surface, wherein the first wiring is provided on a first surface of the elastic dielectric, and is connected to the first connection terminal, the first wiring to output a sensing signal, and wherein the second wiring is provided on a second surface of the elastic dielectric, the second surface facing in a direction away from the first surface, and the second wiring is connected to the second connection terminal, the second wiring is to output a sensing signal, wherein the first connection terminal is on the first circuit board surface of the flexible printed circuit board, and wherein the second connection terminal is on the second circuit board surface of the flexible printed circuit board, the first circuit board surface facing in a first direction, and the second circuit board surface facing in a second direction opposite to the first direction, the first wiring is connected to the first connection terminal on the first circuit board surface, and the second wiring is connected to the second connection terminal of the second circuit board surface.

2. The pressure sensor device of claim 1, wherein the elastic dielectric includes a wiring hole to pass through the first surface of the elastic dielectric and the second surface of the elastic dielectric, wherein the flexible printed circuit board is located on any one of a top surface and a bottom surface of the sensing portion, wherein the first wiring or the second wiring is connected to the first connection terminal or the second connection terminal through the wiring hole of the elastic dielectric.

3. The pressure sensor device of claim 1, wherein the elastic dielectric changes in shape according to pressure applied to the elastic dielectric, and permittivity at a point, at which the shape is changed, changes.

4. The pressure sensor device of claim 1, wherein when a part of the elastic dielectric located between the first wiring and the second wiring changes in shape, a change in capacitance between the first wiring and the second wiring occurs, and a sensing signal generated according to the change in capacitance is transmitted to the flexible printed circuit board through at least any one of the first wiring and the second wiring.

5. The pressure sensor device of claim 1, wherein the first wiring and the second wiring comprise adhesive layers which attach the first wiring and the second wiring to the elastic dielectric.

6. The pressure sensor device of claim 1, wherein the first wiring and the second wiring are formed of conductive fiber materials.

7. The pressure sensor device of claim 1, further comprising a fixing member which fixes the first wiring or the second wiring to the elastic dielectric and the flexible printed circuit board.

8. The pressure sensor device of claim 1, thickness of the elastic dielectric is within 1 to 4 mm.

9. The pressure sensor device of claim 1, the elastic dielectric, including an elastic body and conductive composites dispersed within the elastic body.

10. The pressure sensor device of claim 1, the elastic dielectric includes an elastic body and conductive composites dispersed within the elastic body, and the conductive composites include conductive polymers and conductive powder.

11. The pressure sensor device of claim 1, the elastic dielectric includes an elastic body and conductive composites dispersed within the elastic body, and the conductive composites is within 1 to 10 wt % of the elastomer.

12. The pressure sensor device of claim 1, the elastic dielectric includes an elastic body and conductive composites dispersed within the elastic body, the conductive composites include conductive polymers and conductive powder, and diameter of the conductive powder is within 10 nm to 500 μm.

13. A pressure sensor device comprising:
a sensing portion which comprises an elastic dielectric, a first wiring, and a second wiring, and
a flexible printed circuit board, spaced away from the sensing portion, and the flexible printed circuit board comprises a first connection terminal and a second connection terminal, the flexible printed circuit board having a first circuit board surface and a second circuit board surface, the first circuit board surface facing in a first direction, and the second circuit board surface facing in a second direction opposite to the first direction, and the flexible printed circuit board includes a through hole that passes through the first circuit board surface and the second circuit board surface, wherein the first wiring is provided on a first surface of the elastic dielectric, and is connected to the first connection terminal, the first wiring to output a sensing signal, and wherein the second wiring is provided on a second surface of the elastic dielectric, the second surface facing in a direction away from the first surface, and the second wiring is connected to the second connection terminal, the second wiring is to output a sensing signal, wherein the first connection terminal is on the first circuit board surface of the flexible printed circuit board, and wherein the second connection terminal is on the second circuit board surface of the flexible printed circuit board, the first wiring is connected to the first connection terminal on the first circuit board surface, and the second wiring is connected to the second connection terminal on the second circuit board surface, and wherein the first wiring or the second wiring is connected to the first connection terminal or the second connection terminal through the through hole formed at the flexible printed circuit board between the first circuit board surface and the second circuit board surface.

14. The pressure sensor device of claim 13, wherein the elastic dielectric includes a wiring hole to pass through the first surface of the elastic dielectric and the second surface of the elastic dielectric, wherein the flexible printed circuit board is located on any one of a top surface and a bottom surface of the sensing portion.

* * * * *